(12) United States Patent
Matsumae

(10) Patent No.: US 8,022,403 B2
(45) Date of Patent: Sep. 20, 2011

(54) SEMICONDUCTOR APPARATUS INCLUDING PHOTODIODE UNIT AND METHOD OF INSPECTION OF THE SAME

(75) Inventor: Tomohiko Matsumae, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 91 days.

(21) Appl. No.: 12/458,329

(22) Filed: Jul. 8, 2009

(65) Prior Publication Data
US 2010/0034456 A1 Feb. 11, 2010

(30) Foreign Application Priority Data

Aug. 7, 2008 (JP) ................................. 2008-203767

(51) Int. Cl.
*H01L 23/58* (2006.01)
(52) U.S. Cl. .................. 257/48; 257/435; 257/E31.121; 438/18; 382/145
(58) Field of Classification Search .................... 257/48, 257/435, E31.121; 438/18; 382/145; 324/158
See application file for complete search history.

(56) References Cited

U.S. PATENT DOCUMENTS 6,184,521 B1 * 2/2001 Coffin et al. .............. 250/237 R

FOREIGN PATENT DOCUMENTS

JP 4-354379 8/1992

* cited by examiner

*Primary Examiner* — Jami M Valentine
(74) *Attorney, Agent, or Firm* — McGinn Intellectual Property Law Group, PLLC

(57) ABSTRACT

A semiconductor apparatus has a light-receiving element. The light-receiving element has a photodiode unit having a shield film for removing noise, at least two test pads, and a shield film pseudo pattern which is formed by the same membranous type as the shield film and connected to the two test pads. The photodiode unit and the shield film pseudo pattern are integrated in one semiconductor chip. A resistance value of the shield film pseudo pattern is measured using the test pads connected to the shield film pseudo pattern. CMR of a photocoupler can be evaluated according to the correlation relationship between the measurement result and the sheet resistance of the shield film.

20 Claims, 7 Drawing Sheets

SEMICONDUCTOR APPARATUS INCLUDING PHOTODIODE UNIT AND METHOD OF INSPECTION OF THE SAME

BACKGROUND

1. Field of the Invention

The present invention relates to a semiconductor apparatus and a method for inspection thereof, and particularly to a light-receiving element having a photodiode unit and a method for inspecting a common mode rejection thereof.

2. Description of Related Art

In a photocoupler, a light-emitting element and a light-receiving element are disposed to oppose each other. Usually, a photocoupler has a function to electrically insulates two circuits with different potentials and transmit a signal via light. On the other hand, a photocoupler can be considered as a capacitor which uses the light-emitting and light-receiving sides as electrodes. Therefore, the photocoupler has a stray capacitance Cf between the light-emitting side and the light-receiving side. If a rapidly changing voltage (noise) dv/dt is applied between an input and an output of the photocoupler, a displacement current (I=Cf·dv/dt) flows, thereby generating noise (hereinafter referred to as "electric noise" as appropriate) in the output of the photocoupler. This noise causes malfunction. As one of the indices to indicate the capability to maintain a correct output state, the Common Mode Rejection (CMR) is used. The higher the CMR, the noise resistance is evaluated to be higher. If a steep voltage is applied between the input and output depending on the user environment, a photocoupler of high CMR needs to be selected.

FIG. 5 illustrates a pattern example of a light-receiving element according to a related art. The light-receiving element 80 of FIG. 5 includes a photodiode unit (hereinafter referred to as "PD unit") 81, pads 82-1 to 82-3, and test pads 83-1 to 83-3. In response to a light entered to the PD unit 81, the light-receiving element 80 converts the light into an electric signal. However, electric noise is also input to the PD unit 81 along with the light. Therefore, the PD unit 81 needs to separate the light from the noise. In order to remove the electric noise, a low-resistance shield film (not shown in FIG. 5) is formed in the upper part of the PD unit 81. For example, Japanese Unexamined Patent Application Publication No. 4-354379 discloses a technique concerning a photocoupler having a light-receiving element. The light-receiving element is provided with measures for the shield film by a polysilicon layer in the light-receiving unit of the light-receiving IC. A polysilicon film is used as the shield film.

The mechanism to remove noise by the shield film is explained hereinafter. FIG. 6 shows a pattern diagram of an example of the PD unit cross-section surface of the light-receiving element of a related art. A PD unit 90 includes a shield film (low-resistance shield film) 91, an interlayer film 92, a base region 93, and an epitaxial region 94. The base region 93 and the epitaxial region 94 play a role of the photodiode 95. The shield film 91 is connected to the ground (GND). The electric noise (indicated by the dotted line in FIG. 6) input to the PD unit 90 is removed by this shield film. Accordingly, the shield film 91 allows the light entered to the PD unit 90 (indicated by the solid line in FIG. 6) to transmit therethrough and divert the electric noise to the ground, so that malfunction in the output can be prevented. Therefore, the light-receiving element must be able to remove the noise.

As mentioned above, CMR is used as one of the indices to show the capability to maintain the correct output state, which is the capability to remove noise that causes the malfunction. As shown in FIG. 6, when the shield film removes noise, CMR depends on the sheet resistance value of the shield film. In order to guarantee CMR of a photocoupler, it is desirable to measure CMR for each photocoupler in the photocoupler manufacturing process. The measuring method of CMR is explained hereinafter.

FIG. 7 shows an example of a CMR measuring circuit.

FIG. 8 shows an example of a measurement result. In the CMR measuring circuit, a transistor 72 formed in the light-receiving element of the output is connected to a load resistance ($R_L$). When a pulse ($V_{CM}$) with a steep slope ($V_{CM}/\mu s$) is applied between an input and an output terminal (between P1 and P2) while the power supply voltage ($V_{cc}$) is applied, CMR is observed as a change in a voltage (Vo) between a collector and an emitter of the output transistor 72. CMR indicates a maximum voltage change ($V_{CM}/\mu s$) in which the photocoupler does not malfunction by the noise. A pulse of 10 kV or more is applied to evaluate CMR. More specifically, to measure CMR, a malfunction ($V_{r2}$ in FIG. 8) in a falling pulse is measured while an input forward current $I_F$ to a light-emitting diode 71 exists, and a malfunction ($V_{r1}$ in FIG. 8) in a rising pulse while the input forward current $I_F$ to the light-emitting diode 71 does not exist. CMR is defined as the maximum voltage change ($V_{CM}/\mu s$) of the largest $V_{CM}$ in which Vo change is predetermined level or below.

CMR of a photocoupler is generally required to be 10 kV/$\mu s$ or more. Thus a pulse of 10 kV/$\mu s$ or more must be applied to measure the CMR. CMR cannot be measured by a normal electrical properties evaluation equipment in an assembly line, and a special simple measuring device as shown in FIG. 9 is used.

The measuring method is that a photocoupler is mounted to a test board 61, a pulse is applied by a high-pressure equipment 62 while checking an oscilloscope 63 so as to check a change in the output waveform. However, for each of the photocoupler, this method requires tasks of mounting the photocoupler to the test board 61, applying a pulse, checking waveform, and demounting. Accordingly, this method takes time. Therefore, it is difficult to evaluate all photocouplers and necessary to manually check by sample. A dedicated automatic evaluation equipment can be implemented but it will be a large business investment.

As described so far, a photocoupler has a stray capacitance between the light-emitting and light-receiving side. Thus malfunctions caused by noise must be prevented. The quality of the photocoupler can be indicated by showing the capability to remove noise using the CMR properties. However, as a predetermined voltage is required to measure CMR of a photocoupler, it is difficult and also costly. Therefore, only a limited number of products can be measured.

SUMMARY

As mentioned above, the present inventor has found a problem that it is difficult to measure all the CMR properties of a photocoupler.

An exemplary aspect of an embodiment of the present invention is a semiconductor apparatus that includes a light-receiving element. The light-receiving element includes a photodiode unit having a shield film that removes electric noise, at least two test pads, and a shield film pseudo pattern formed by a same membranous type as the shield film and connected to the two test pads. A resistance value of the shield film pseudo pattern is measured using the test pads connected to the shield film pseudo pattern. CMR of a photocoupler can be measured according to the correlation relationship between the measurement result and the sheet resistance of the shield film.

Another exemplary aspect of an embodiment of the present invention is a chip of a light-receiving element that includes a photodiode unit having a shield film for removing electric noise, at least two test pads, and a shield film pseudo pattern formed by a same membranous type as the shield film and connected to the two test pads.

Another exemplary aspect of an embodiment of the present invention is a method of inspecting the abovementioned semiconductor apparatus that includes measuring the resistance value of the shield film pseudo pattern and evaluating a common mode rejection according to the measured resistance value.

The present invention facilitates CMR measurement of a photocoupler.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
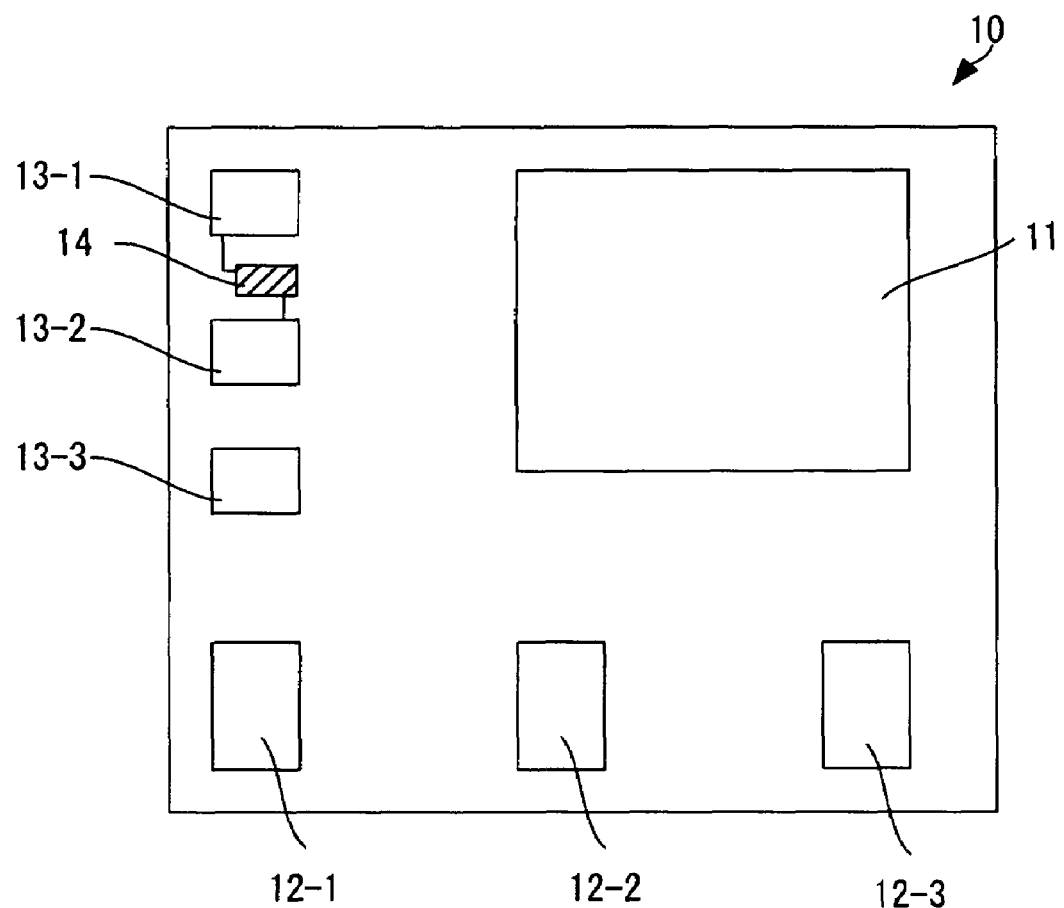
FIG. 1 is a plan view showing an example of the configuration of a light-receiving element according to the present invention.

Hereafter, an embodiment of the present invention is described with reference to the drawings. For clarity's sake, the following description and drawings are omitted and simplified as appropriate. In the drawings, components and corresponding sections having identical configurations or functions are denoted by reference numerals with detailed description omitted.

In this document, if there are multiple same components and if they need to be differentiated from each other, they are appended by the code of "–n" (n is an integer more than 1). For example, FIG. 1 shows several pads 12-1, 12-2, and 12-3. In the explanation using FIG. 1, the pad 12 indicates one or multiple pads 12-1 to 12-3. The pad 12-1 (or the pad 12-2 etc.) indicates the corresponding pad among the multiple pads.

First Exemplary Embodiment

FIG. 1 is a plan view showing a pattern example of a light-receiving element according to the present invention. A light-receiving element 10 includes a photodiode unit (PD unit) 11, the pads 12, test pads 13, and a shield film pseudo pattern 14. The PD unit 11 and the shield pseudo pattern 14 are accumulated over one semiconductor chip (Si chip). In FIG. 1, there are 3 each of the pads 12 and the test pads 13. However it is not limited to this number but changes with light-receiving element pattern. However, at least 2 test pads 13 are placed.

The PD unit 11 may only be the configuration to remove noise by the shield film. For example, the PD unit 11 may have the cross-section configuration of FIG. 6 or other configuration.

The shield film pseudo pattern 14 is formed by the same membranous film as the shield film used for the PD unit 11, and is electrically connected with the two different test pads 13. The shield film pseudo pattern 14 is minimized and placed in the free space. In FIG. 1, the shield film pseudo pattern 14 is placed between the test pads 13-1 and 13-2, and is connected to each of the test pads. The shield film pseudo pattern 14 is not necessarily placed between the two test pads. However it is a preferable arrangement in terms of saving space in a chip. Existing pads can be used for the test pads 13 and it is not necessary to prepare test pads in particular.

The resistance values of the shield film and the shield film pseudo pattern 14 of the PD unit 11 are proportional to each other according to the size of the shield film. The resistance value of the shield film pseudo pattern 14 can be measured by an electrical property evaluation equipment used in manufacturing process. The photocoupler is required of the quality having CMR more than a predetermined value. Therefore if the relationship between the shield film sheet resistance and CMR can be obtained in advance, CMR of the shield film formed in the PD unit 11 can be estimated according to the resistance value of the shield film pseudo pattern. From the above explanation, the method of calculating CMR of a photocoupler is explained hereinafter.

Figure 2:
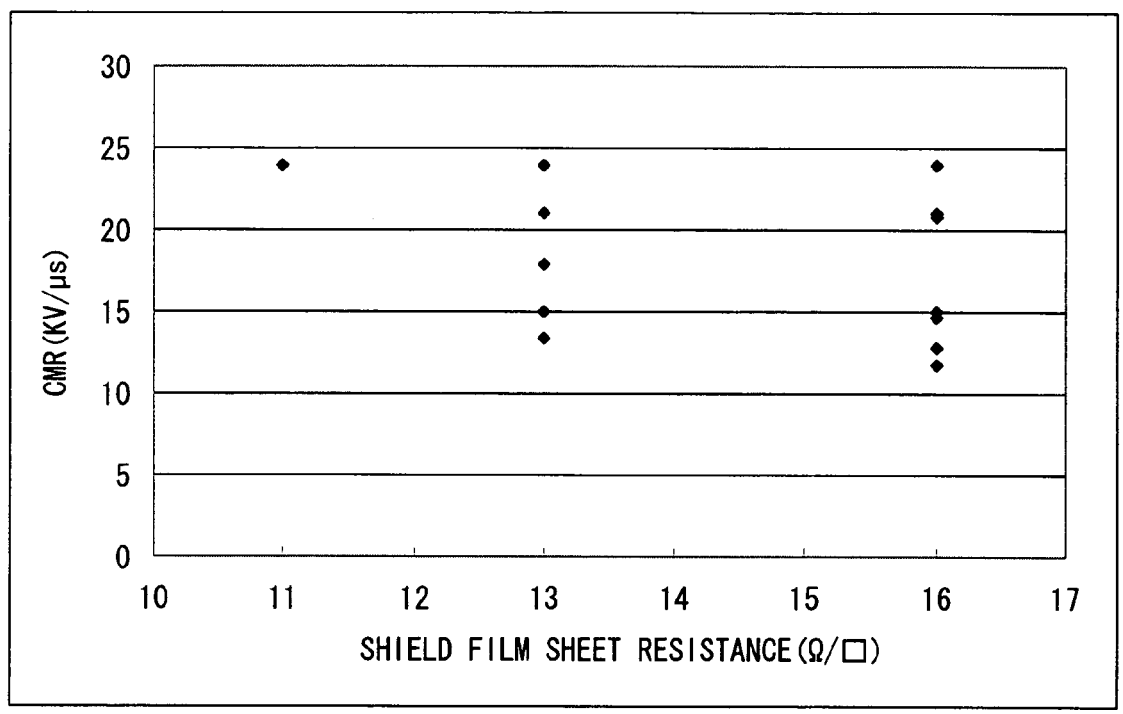
FIG. 2 depicts the relationship between a sheet resistance of a shield film and CMR.
Figure 9:
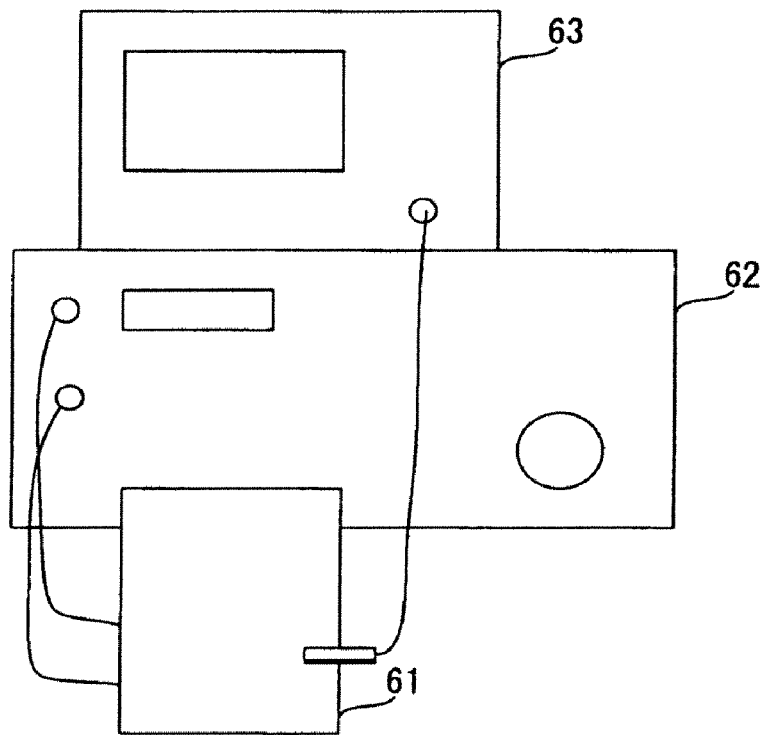
FIG. 9 depicts s a simple measuring equipment of CMR of a related art.

FIG. 2 shows the relationship between the sheet resistance of the shield film and CMR. The data shown in FIG. 2 is a result of measuring the relationship between the sheet resistance and CMR for the shield film formed in the PD unit 11. The sheet resistance of the shield film and the resistance value of the shield film pseudo pattern formed by the same membrane type as the shield film are proportional. Therefore, CMR can be alternatively measured by obtaining the correlation between the resistance value measurement result of the shield film pseudo pattern 14 using the electrical properties evaluation equipment and the actual CMR evaluation result. In this case, the resistance of the shield film pseudo pattern 14 can be measured by the electrical properties evaluation equipment used in photocoupler manufacturing process, without using the device as shown in FIG. 9. Therefore, CMR of all the photocouplers can be measured using the electrical properties evaluation equipment and no investment is needed for a CMR automatic measuring equipment. This enables to measure CMR of all the photocouplers to be manufactured while suppressing the time and cost needed for the measurement.

As explained above, CMR can alternatively be measured by measuring the resistance value using the shield film pseudo pattern 14. Therefore, the shield film pseudo pattern 14 is formed by the same process as the shield film of the PD unit 11 and in the same layer as the shield film of the PD unit 11. Specifically, same kind of the shield film as the shield film placed in the PD unit 11 is formed along with a pattern such as a GND connection etc. and electrical connections concerning the shield film. It is preferred to form a pattern in a range that the resistance value of the shield film pseudo pattern 14 can be correctly measured.

Figure 6:
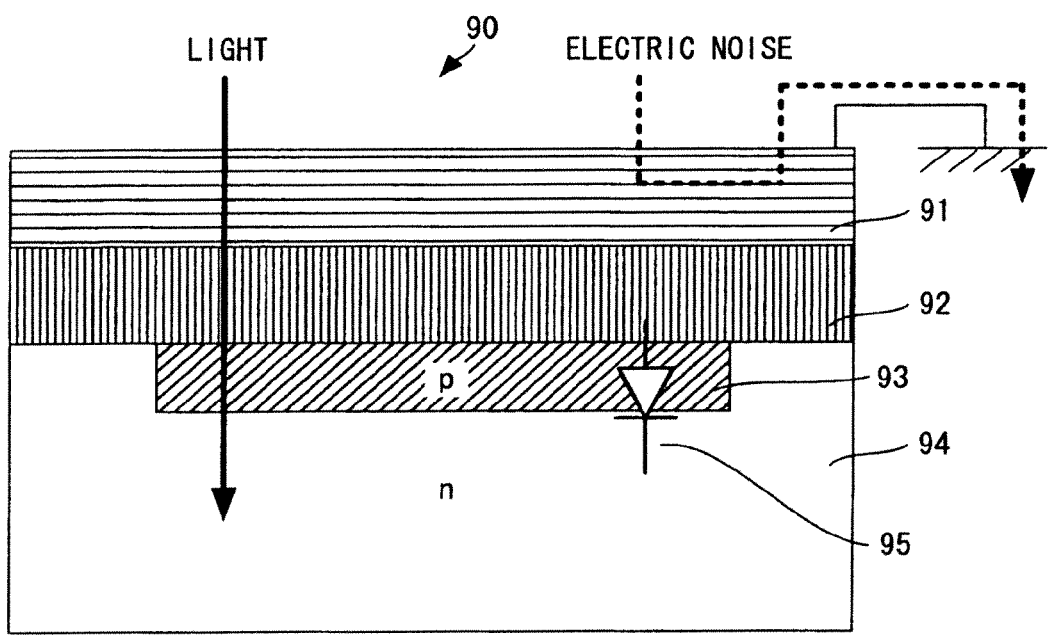
FIG. 6 is a pattern diagram showing an example of a PD unit cross-section of a light-receiving element of the related art.
Figure 7:
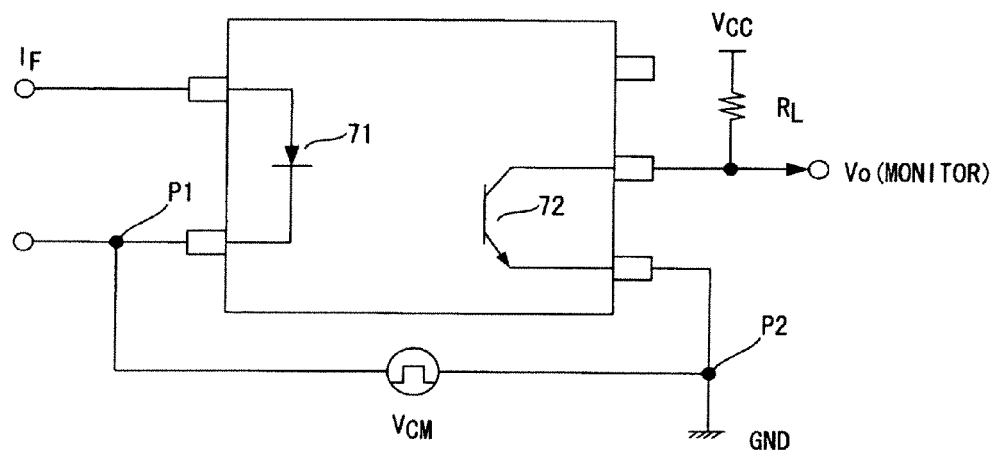
FIG. 7 depicts an example of a CMR measuring circuit.
Figure 8:
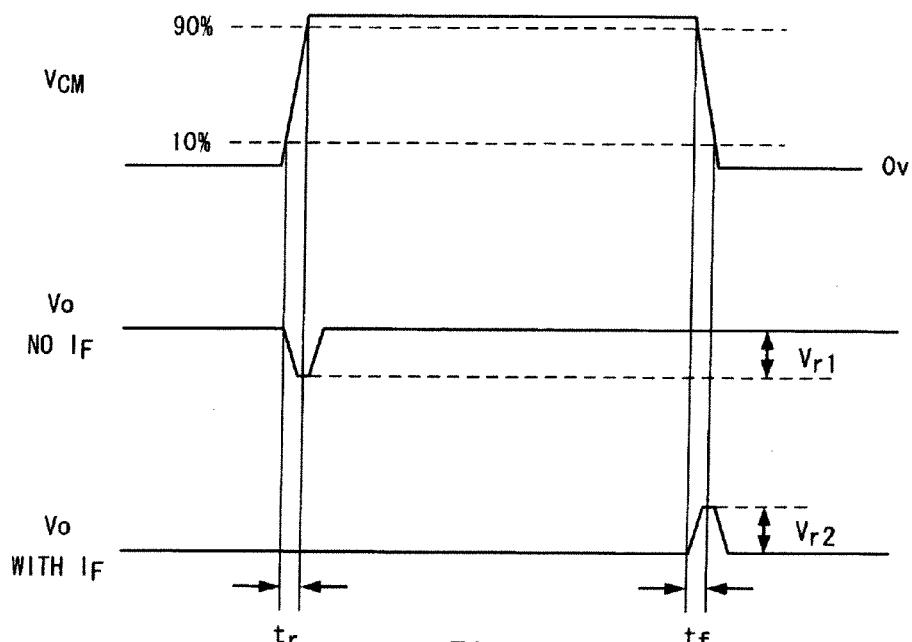
FIG. 8 depicts an example of a CMR measurement result.

For example, in a cross-sectional diagram of FIG. 6, a pattern of a section connected to the shield film 91 and the ground is also formed to the shield film pseudo patter 14. The shield film pseudo pattern 14 is connected to the two test pads 13. However one of the test pads 13 is used as a ground and a voltage is applied from the other test pad. In this way, a similar electronic environment is created as the shield film placed in the PD unit 11.

Figure 3:
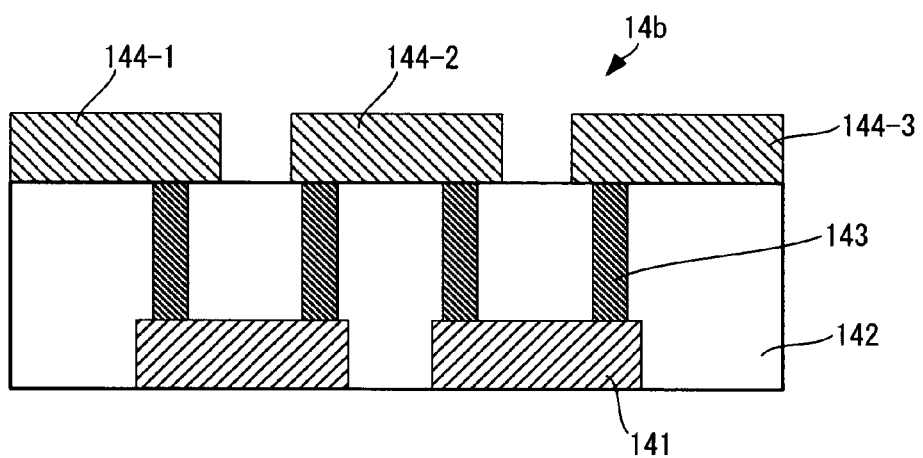
FIG. 3 is a cross-sectional diagram illustrating an example of a shield film pseudo pattern in case the GND connection of the shield film is made by raising a VIA hole.
Figure 4:
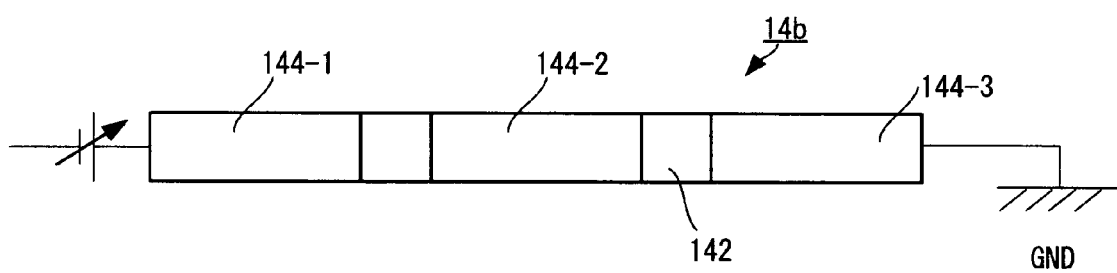
FIG. 4 is a plan view of a shield film pseudo pattern having the cross-section surface of FIG. 3 when viewed from above.
Figure 5:
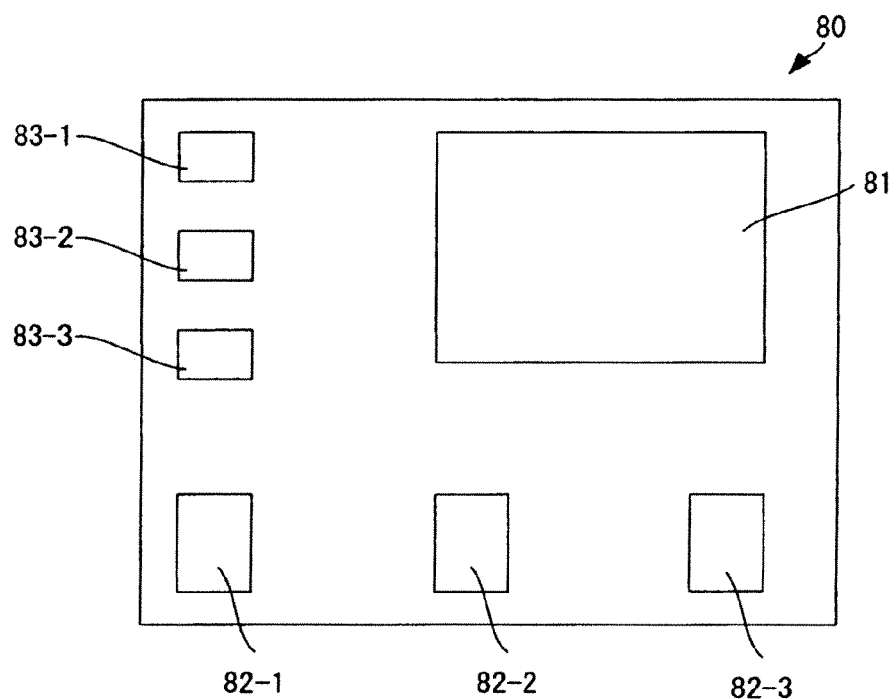
FIG. 5 is a plan view showing an example of a light-receiving pattern of a related art.

More specifically, if the GND connection of the shield film is made by raised by a VIA hole, it is preferable to develop the cross-sectional structure thereof also to the pseudo pattern. FIG. 3 illustrates a cross-section example of the shield film pseudo pattern in case the GND connection of the shield film is raised by a VIA hole. A shield film pseudo pattern 14b has a shield film 141, an interlayer film 142, a VIA hole 143, and an aluminum film 144. The shield film pseudo pattern 14b shown in FIG. 3 is formed in the same process as the PD unit 11. Therefore, other anomalies associated with the shield film (VIA hole misalignment and an anomalous contact resistance etc.) is detected as an abnormal resistance value. FIG. 4 is a front view of the shield film pseudo pattern having the cross-section surface of FIG. 3 when viewed from above. Three aluminum films 144-1 to 144-3 are shown in FIG. 4. As for the shield film pseudo pattern 14b, one of the aluminum film 144-3 is connected to the GND, and a voltage is applied from another aluminum film 144-1. By applying a voltage, a current flows into the shield film pseudo pattern 14b. This makes it possible to measure the resistance value of the shield film 141 from the current value.

Thus, in this embodiment, the correlation between the shield film formed in the PD unit 11 and CMR is obtained beforehand. Further, the shield film formed in the PD unit 11 is formed in the same process as the shield film pseudo patterns 14 and 14b. Both ends of the shield film pseudo patterns 14 and 14b are connected to the test pads 13. By using the same kind of film as the shield film of the PD unit 11 for the shield film pseudo patterns 14 and 14b, the shield film pseudo patterns 14 and 14b, which are correlated with CMR, are provided to each chip. The resistance value between the test pads 13 is measured using the electrical properties evaluation equipment of a related art. This enables to measure all the CMR by the electrical properties evaluation equipment before shipment. Moreover, there is another effect expected that anomalies associated with the shield film can be detected.

As described above, the present invention enables to measure CMR properties of all the products without new investment and more man-hour. The following effects are can be expected. For example, it is desirable to pull out the test pads from the both ends of the shield film that covers the upper part of the PD unit and directly measure the CMR properties by the electrical property evaluation equipment. However, by forming the shield film pseudo pattern, which is a minimized shield film, the shield film pseudo pattern can be placed in the free space. As the free space of the chip is utilized in this way, it is possible to evaluate CMR without increasing the chip size. More specifically, it can be realized by a smaller chip size as compared to the case of pulling out the test pads from the shield film of the PD unit. Further, by forming the shield film pseudo pattern, it is possible to find other anomalies associated with the shield film by the test pads, not only CMR, as described above.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor apparatus comprising:
   a photodiode unit having a shield film that removes electric noise;
   at least two test pads; and
   a shield film pseudo pattern, spaced apart from the photodiode lode unit, formed by a same membranous type as the shield film, the shield film pseudo pattern being connected to the two test pads,
   wherein the photodiode unit and the shield film pseudo pattern are integrated in one semiconductor chip.

2. The semiconductor apparatus according to claim 1, wherein the shield film pseudo pattern is formed in a same layer as the shield film included in the photodiode unit.

3. The semiconductor apparatus according to claim 1, wherein the shield film pseudo pattern is connected to a ground, and
   wherein the shield film pseudo pattern has a same pattern of a sheet resistance as the shield film included in the photodiode unit.

4. The semiconductor apparatus according to claim 2, wherein the shield film pseudo pattern is connected to a ground, and
   wherein the shield film pseudo pattern has a same pattern of a sheet resistance as the shield film included in the photodiode unit.

5. The semiconductor apparatus according to claim 1, wherein the shield film pseudo pattern is formed between the two test pads.

6. The semiconductor apparatus according to claim 2, wherein the shield film pseudo pattern is formed between the two test pads.

7. The semiconductor apparatus according to claim 3, wherein the shield film pseudo pattern is formed between the two test pads.

8. The semiconductor apparatus according to claim 4, wherein the shield film pseudo pattern is formed between the two test pads.

9. A method of inspecting the semiconductor apparatus of claim 1, the method comprising:
   measuring a correlation relationship between a sheet resistance of the shield film and a common mode rejection beforehand;
   measuring a resistance value of the shield film pseudo pattern; and
   evaluating a common mode rejection of a photocoupler using the measured resistance value and the correlation relationship.

10. The method according to claim 9, wherein the shield film pseudo pattern is formed in a same layer as the shield film included in the photodiode unit.

11. The method according to claim 9, wherein the shield film pseudo pattern is connected to a ground, and
    wherein the shield film pseudo pattern has a same pattern of a sheet resistance as the shield film included in the photodiode unit.

12. The method according to claim 9 wherein the shield film pseudo pattern is formed between the two test pads.

13. The method according to claim 9, wherein one of the test pads connected to the shield film pseudo pattern is placed to a ground, and
    a voltage is applied from another test pad to the semiconductor apparatus.

14. The method according to claim 10, wherein one of the test pads connected to the shield film pseudo pattern is placed to a ground, and
   a voltage is applied from another test pad to the semiconductor apparatus.

15. The method according to claim 11, wherein one of the test pads connected to the shield film pseudo pattern is placed to a ground, and
   a voltage is applied from another test pad to the semiconductor apparatus.

16. The method according to claim 12, wherein one of the test pads connected to the shield film pseudo pattern is placed to a ground, and
   a voltage is applied from another test pad to the semiconductor apparatus.

17. The semiconductor apparatus according to claim 1, wherein a resistance value of the shield film and the shield film pseudo pattern are proportional to each other according to a size of the shield film and the shield film pseudo pattern.

18. The semiconductor apparatus according to claim 1, wherein the shield film pseudo pattern comprises:
   a shield film;
   an aluminum film disposed above the shield film; and
   a via hole connecting the shield film to the aluminum film.

19. The semiconductor apparatus according to claim 1, wherein the shield film pseudo pattern comprises:
   a shield film;
   a plurality of aluminum films disposed above the shield film; and
   a plurality of via holes connecting the shield film to the aluminum films.

20. The semiconductor apparatus according to claim 19, wherein a first aluminum film of the plurality of aluminum films is connected to a ground and a voltage is applied through a second aluminum film of the plurality of aluminum films.

* * * * *